United States Patent
Yang et al.

(10) Patent No.: US 11,201,193 B2
(45) Date of Patent: Dec. 14, 2021

(54) VERTICALLY STACKED MULTILAYER HIGH-DENSITY RRAM

(71) Applicant: QUALCOMM Incorporated, San Diego, CA (US)

(72) Inventors: Bin Yang, San Diego, CA (US); Xia Li, San Diego, CA (US); Gengming Tao, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 16/752,288

(22) Filed: Jan. 24, 2020

(65) Prior Publication Data

US 2021/0233959 A1 Jul. 29, 2021

(51) Int. Cl.
*H01L 27/24* (2006.01)
*H01L 45/00* (2006.01)

(52) U.S. Cl.
CPC ........ *H01L 27/249* (2013.01); *H01L 27/2436* (2013.01); *H01L 45/08* (2013.01); *H01L 45/1253* (2013.01); *H01L 45/146* (2013.01); *H01L 45/1683* (2013.01)

(58) Field of Classification Search
None
See application file for complete search history.

(56) References Cited

U.S. PATENT DOCUMENTS

| | | | |
|---|---|---|---|
| 2015/0325628 A1* | 11/2015 | Nonoguchi | H01L 45/1226 257/3 |
| 2017/0125483 A1* | 5/2017 | Tanaka | H01L 45/1253 |
| 2018/0047787 A1* | 2/2018 | Nakamura | H01L 27/2427 |
| 2019/0288035 A1* | 9/2019 | Imamura | H01L 45/1253 |

OTHER PUBLICATIONS

Chen H-Y., et al., "HfOx Based Vertical Resistive Random Access Memory for Cost-Effective 3D Cross-Point Architecture without Cell Selector," 2012 International Electron Devices Meeting, IEEE, pp. 20.7.1-20.7.4.

* cited by examiner

*Primary Examiner* — J. E. Schoenholtz
(74) *Attorney, Agent, or Firm* — Patterson & Sheridan, L.L.P.

(57) ABSTRACT

Certain aspects of the present disclosure generally relate to a vertically stacked multilayer resistive random access memory (RRAM) and methods for fabricating such an RRAM. The vertically stacked multilayer RRAM generally includes a planar substrate layer and a plurality of metal-insulator-metal (MIM) stacks, each MIM stack structure of the plurality of MIM stacks comprising a plurality of MIM structures extending orthogonally above the planar substrate.

16 Claims, 17 Drawing Sheets

400

402

FORM A PLURALITY OF METAL-INSULATOR-METAL (MIM) STACKS ABOVE A PLANAR SUBSTRATE, WHEREIN: EACH MIM STACK STRUCTURE OF THE PLURALITY OF MIM STACKS COMPRISES A PLURALITY OF MIM STRUCTURES EXTENDING ORTHOGONALLY ABOVE THE PLANAR SUBSTRATE, EACH MIM STRUCTURE OF THE PLURALITY OF MIM STRUCTURES COMPRISES A FIRST ELECTRODE LAYER, A RESISTIVE-SWITCHING MATERIAL LAYER, AND A SECOND ELECTRODE LAYER, THE RESISTIVE-SWITCHING MATERIAL LAYER IS DISPOSED SUBSTANTIALLY BETWEEN THE FIRST ELECTRODE LAYER AND THE SECOND ELECTRODE LAYER, EACH OF THE FIRST ELECTRODE LAYER, THE RESISTIVE-SWITCHING MATERIAL LAYER, AND THE SECOND ELECTRODE LAYER COMPRISES A LONGER DIMENSION AND A SHORTER DIMENSION, THE LONGER DIMENSION OF EACH OF THE FIRST ELECTRODE LAYER, THE RESISTIVE-SWITCHING MATERIAL LAYER, AND THE SECOND ELECTRODE LAYER EXTENDS ORTHOGONALLY ABOVE THE PLANAR SUBSTRATE IN A SAME DIRECTION, THE PLURALITY OF MIM STRUCTURES COMPRISES A FIRST MIM STRUCTURE AND A SECOND MIM STRUCTURE, THE SECOND MIM STRUCTURE IS STACKED VERTICALLY ON TOP OF THE FIRST MIM STRUCTURE, THE FIRST ELECTRODE LAYER OF THE FIRST MIM STRUCTURE IS ELECTRICALLY DISCONNECTED FROM THE FIRST ELECTRODE LAYER OF THE SECOND MIM STRUCTURE, AND THE RESISTIVE-SWITCHING MATERIAL LAYER OF THE FIRST MIM STRUCTURE IS SEPARATED FROM THE RESISTIVE-SWITCHING MATERIAL LAYER OF THE SECOND MIM STRUCTURE

FIG. 4

VERTICALLY STACKED MULTILAYER HIGH-DENSITY RRAM

TECHNICAL FIELD

Certain aspects of the present disclosure generally relate to electronic components and, more particularly, to a vertically stacked multilayer high-density resistive random access memory (RRAM).

BACKGROUND

Resistive random access memory (RRAM) devices use resistance-based storage elements to store information. For example, a resistance-based storage element may be programmed to a high resistance state to indicate a particular value (e.g., a logic "1" value) or to a low resistance state to indicate another value (e.g., a logic "0" value). The state of the resistance-based storage element may be sensed by applying a voltage to the resistance-based storage element and by sensing a current through the resistance-based storage element that results from the voltage. The current may indicate (by Ohm's law) the state of the resistance-based storage element.

In some cases, the resistance-based storage elements of RRAM devices may be implemented by generating defects in a thin oxide layer located between two electrode layers. These defects in the oxide layer may be referred to as "oxygen vacancies," which are oxide bond locations where the oxygen has been removed. Oxygen vacancies may be charged and drift in the presence of an electric field, analogous to the motion of holes and electrons in semiconductors.

RRAM devices may, in some cases, be associated with high costs of fabrication. For example, an RRAM device may include multiple interconnects to access the resistance-based storage elements, such as a crossbar array of metal wires. The metal wires may intersect near each resistance-based storage element to enable access to each resistance-based storage element. The crossbar array may occupy a large area of an integrated circuit and may be complicated to operate in some cases. Further, the crossbar array may be fabricated using a mask, which increases fabrication cost.

SUMMARY

Certain aspects of the present disclosure are generally directed to a vertically stacked multilayer resistive random access memory (RRAM).

Certain aspects of the present disclosure provide an RRAM device, such as a vertically stacked multilayer RRAM device. The RRAM device generally includes a planar substrate and a plurality of metal-insulator-metal (MIM) stacks, wherein: each MIM stack structure of the plurality of MIM stacks comprises a plurality of MIM structures extending orthogonally above the planar substrate, each MIM structure of the plurality of MIM structures comprises a first electrode layer, a resistive-switching material layer, and a second electrode layer, the resistive-switching material layer is disposed substantially between the first electrode layer and the second electrode layer, each of the first electrode layer, the resistive-switching material layer, and the second electrode layer comprises a longer dimension and a shorter dimension, the longer dimension of each of the first electrode layer, the resistive-switching material layer, and the second electrode layer extends orthogonally above the planar substrate in a same direction, the plurality of MIM structures comprises a first MIM structure and a second MIM structure, the second MIM structure is stacked vertically on top of the first MIM structure, the first electrode layer of the first MIM structure is electrically disconnected from the first electrode layer of the second MIM structure, and the resistive-switching material layer of the first MIM structure is separated from the resistive-switching material layer of the second MIM structure.

Certain aspects of the present disclosure generally relate to a method for fabricating an RRAM device, such as a vertically stacked, multilayer RRAM device. The method generally includes forming a plurality of metal-insulator-metal (MIM) stacks above a planar substrate, wherein: each MIM stack structure of the plurality of MIM stacks comprises a plurality of MIM structures extending orthogonally above the planar substrate, each MIM structure of the plurality of MIM structures comprises a first electrode layer, a resistive-switching material layer, and a second electrode layer, the resistive-switching material layer is disposed substantially between the first electrode layer and the second electrode layer, each of the first electrode layer, the resistive-switching material layer, and the second electrode layer comprises a longer dimension and a shorter dimension, the longer dimension of each of the first electrode layer, the resistive-switching material layer, and the second electrode layer extends orthogonally above the planar substrate in a same direction, the plurality of MIM structures comprises a first MIM structure and a second MIM structure, the second MIM structure is stacked vertically on top of the first MIM structure, the first electrode layer of the first MIM structure is electrically disconnected from the first electrode layer of the second MIM structure, and the resistive-switching material layer of the first MIM structure is separated from the resistive-switching material layer of the second MIM structure.

BRIEF DESCRIPTION OF THE DRAWINGS

So that the manner in which the above-recited features of the present disclosure can be understood in detail, a more particular description, briefly summarized above, may be by reference to aspects, some of which are illustrated in the appended drawings. It is to be noted, however, that the appended drawings illustrate only certain typical aspects of this disclosure and are therefore not to be considered limiting of its scope, for the description may admit to other equally effective aspects.

FIG. 4 is a flow diagram illustrating example operations for fabricating an RRAM device, such as a vertically stacked multilayer RRAM, in accordance with certain aspects of the present disclosure.

DETAILED DESCRIPTION

Figure 1:
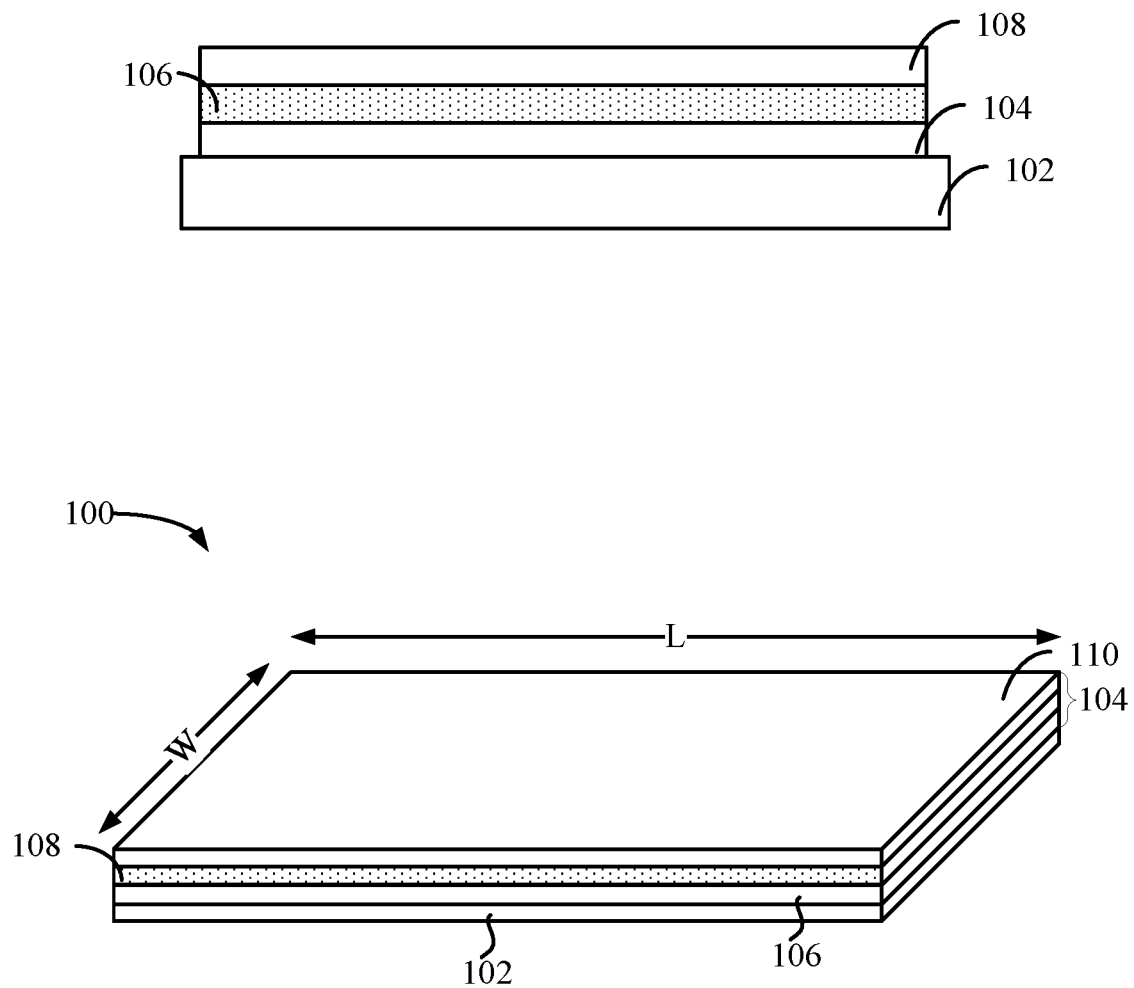
FIG. 1 is a cross-sectional view of a conventional resistive random access memory (RRAM).

Certain aspects of the present disclosure are generally directed to a vertically stacked multilayer high-density resistive random access memory (RRAM). The vertically stacked multilayer RRAM generally includes a planar substrate layer and a plurality of metal-insulator-metal (MIM) stacks each including a plurality of fin-like metal-insulatormetal (MIM) structures stacked vertically on top of each other above the substrate layer.

The word "exemplary" is used herein to mean "serving as an example, instance, or illustration." Any aspect described herein as "exemplary" is not necessarily to be construed as preferred or advantageous over other aspects.

As used herein, the term "connected with" in the various tenses of the verb "connect" may mean that element A is directly connected to element B or that other elements may be connected between elements A and B (i.e., that element A is indirectly connected with element B). In the case of electrical components, the term "connected with" may also be used herein to mean that a wire, trace, or other electrically conductive material is used to electrically connect elements A and B (and any components electrically connected therebetween).

Certain terminology may also be used in the following description for the purpose of reference only, and thus are not intended to be limiting. For example, terms such as "upper," "lower," "above," "below," "bottom," and "top" refer to directions in the drawings to which reference is made. Terms such as "front," "back," "rear," and "side" describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import.

Example Planar Rram

FIG. 1 illustrates a three-dimensional cross-section of a conventional planar RRAM 100. As illustrated, the RRAM 100 may comprise a substrate layer 102 with dimensions L×W, where L is length and W is width. The substrate layer 102 may be a substrate employed in a semiconductor process, such as a silicon substrate or any other suitable material (e.g., glass, ceramic, aluminum oxide ($Al_2O_3$), etc.). FIG. 1 depicts the substrate layer 102 as a rectangular cuboid with rectangular faces in order to illustrate the concept, and is not intended to be limiting. For example, there may be other shapes and sizes of the substrate layer 102, as well as intervening layers.

As illustrated, a planar metal-insulator-metal (MIM) structure 104, forming a RRAM cell, may be disposed on top of the substrate layer 102. For example, as illustrated, the MIM structure 104 may comprise a first electrode layer 106, a resistive-switching material layer 108, and a second electrode layer 110. The first electrode layer 106, the second electrode layer 110, and the resistive-switching material layer 108 have an in-plane (or "horizontal") configuration (e.g., where read and write currents are generated "horizontally" to, or substantially parallel to, a top surface of the substrate layer 102.

The resistive-switching material layer 108 may comprise a dielectric material and, thus, may normally be insulating. However, when a sufficient voltage (known as a "forming voltage") is applied between the first electrode layer 106 and the second electrode layer 110, one or more conductive pathways will form in the resistive-switching material layer 108. Through the appropriate application of various voltages (e.g. a set voltage and reset voltage), the conductive pathways may be modified to form a high resistance state or a low resistance state. For example, a resistive-switching material may change from a first resistivity to a second resistivity upon the application of a set voltage, and from the second resistivity back to the first resistivity upon the application of a reset voltage.

An RRAM cell may be regarded as storing a logical bit. Where the resistive-switching element has increased resistance, the RRAM cell may be regarded as storing a "0" bit (a logical low state); where the resistive-switching element has reduced resistance, the RRAM cell may be regarded as storing a "1" bit (a logical high state). In some cases, circuitry may be used to read the resistive state of the resistive-switching element by applying a read voltage to the two electrodes and measuring the corresponding current through the resistive-switching element. If the current through the resistive-switching element is greater than some predetermined baseline current, the resistive-switching element is deemed to be in a reduced resistance state, and therefore the RRAM cell is storing a logical "1." On the other hand, if the current through the resistive-switching element is less than some predetermined baseline current, then the resistive-switching element is deemed to be in an increased resistance state, and therefore the RRAM cell is storing a logical "0." It should be noted that the resistive states and corresponding logical values are only meant as examples and that the high resistive state could correspond to a logical "1" and the low resistive state could correspond to a logical "0."

Conventional RRAM offers much faster, bit-alterable, erase-free operation and may, for example, deliver 100× lower read latency and 1000× faster write performance than traditional flash memory. Additionally, RRAM may be architected with smaller pages to reduce read and write latencies, lower energy, and increased lifetime of the storage solutions. However, conventional RRAM structures, such as the RRAM 100 illustrated in FIG. 1, come with certain disadvantages. For example, as illustrated in FIG. 1, the RRAM 100 consumes a large amount of area, which may limit RRAM scaling size/memory density, as well as be costly to produce.

Thus, to help alleviate these issues with conventional RRAM structures, aspects of the present disclosure provide a vertically stacked multilayer RRAM structure (as well as techniques for fabricating the same) that increases RRAM density and lowers fabrication cost compared to conventional RRAM structures. For example, the vertically stacked multilayer RRAM structure described herein may take advantage of an advanced complementary metal-oxide-semiconductor (CMOS) self-aligned process, which may lower fabrication cost associated with the RRAM and allow for more accurate control over RRAM cell pitch (e.g., the spacing between RRAM cells in RRAM).

Example Vertical Rram

Figure 2:
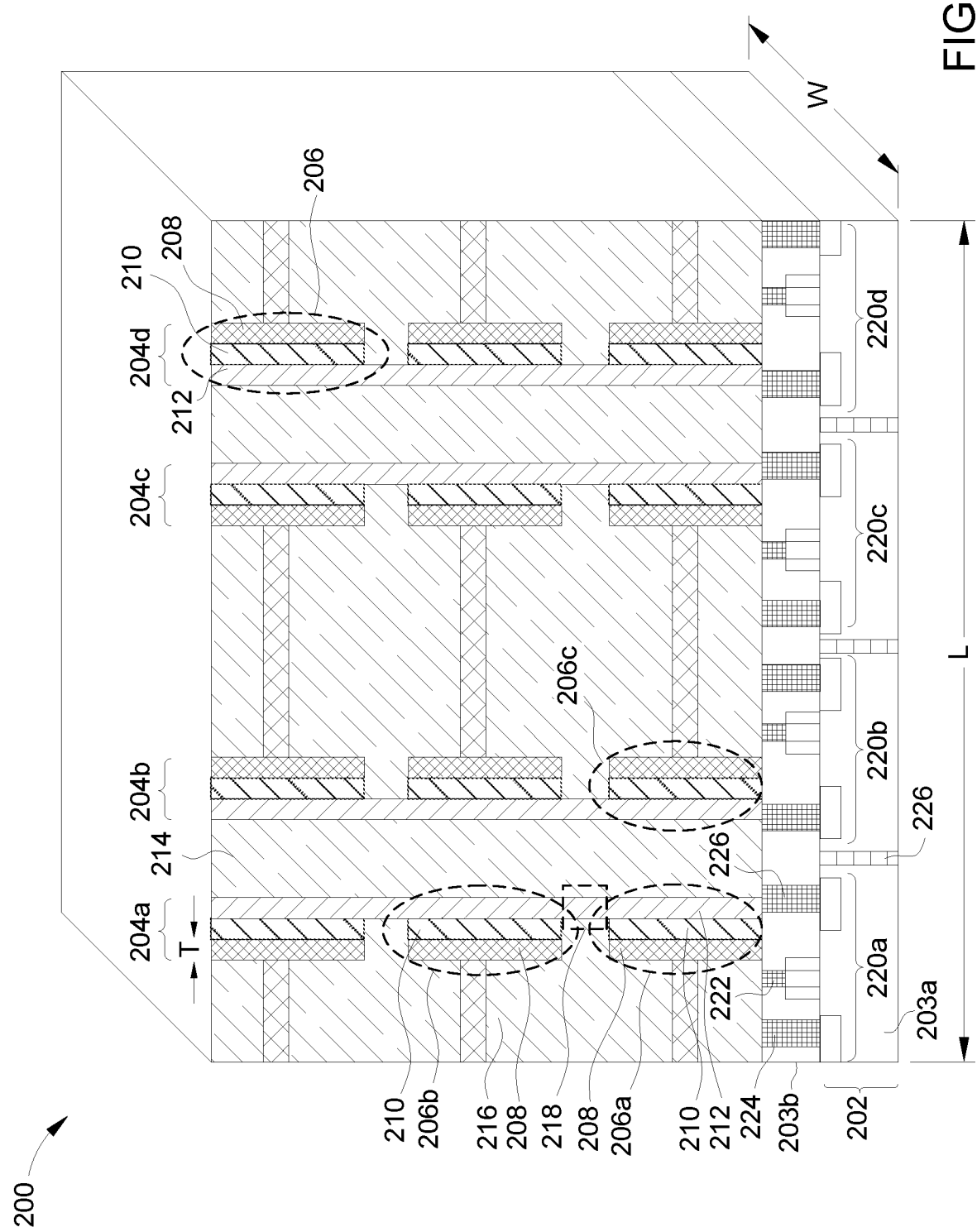
FIG. 2 illustrates an example cross-section of a vertically stacked multilayer resistive random access memory (RRAM), according to certain aspects presented herein.

FIG. 2 illustrates an example cross-section of a vertically stacked multilayer RRAM 200, according to certain aspects presented herein. As illustrated, the vertically stacked multilayer RRAM 200 may include a planar substrate 202 with dimensions L×W, where L is length and W is width. According to aspects, in some cases, the planar substrate 202 may be composed of any suitable semiconductive or insulative material, such as silicon, glass, ceramic, or aluminum oxide ($Al_2O_3$). In some cases, the planar substrate 202 may comprise a first layer 203a and a second layer 203b deposited on top of the first layer 203a (e.g., as shown and described in greater detail below). In some cases, the first layer 203a comprises one of silicon, glass, ceramic, or aluminum oxide. Additionally, in some cases, the second layer 203b comprises silicon dioxide ($SiO_2$). In some cases, the second layer 203b may comprise an active device layer and may include one or more embedded devices, such as front-end-of-line (FEOL) transistors 220a-220d (collectively referred to as "transistors 220") comprising one or more of a gate contact 222 and a source/drain contact 224. Additionally, in some cases, the planar substrate 202 may include one or more shallow trench isolation (STI) structures 226 separating the embedded devices.

Additionally, as illustrated, the vertically stacked multilayer RRAM 200 may include a plurality of metal-insulator-metal (MIM) stacks 204a-204d (collectively referred to as "MIM stacks 204"). It should be understood that, while FIG. 2 only illustrates four MIM stacks, the vertically stacked multilayer RRAM 200 is not limited to only four MIM stacks and may include any number of MIM stacks 204.

According to aspects, each MIM stack 204 may include a plurality of stacked fin-like MIM structures 206 extending orthogonally above the planar substrate 202 (e.g., stacked vertically with respect to the horizontal plane of the substrate 202). According to certain aspects, each MIM structure of the plurality of MIM structures 206 may make up a single RRAM cell (also referred to herein as "a memory cell") comprising two electrodes separated by a resistive-switching material.

For example, as shown, each MIM structure 206 comprises a first electrode layer 208, a resistive-switching material layer 210, and a second electrode layer 212. According to aspects, as shown, the resistive-switching material layer 210 is disposed substantially between the first electrode layer 208 and the second electrode layer 212, forming an RRAM cell.

Further, as shown, each of the first electrode layer 208, the resistive-switching material layer 210, and the second electrode layer 212 comprise a longer dimension (e.g., height, labeled "H" in FIG. 2) and a shorter dimension (e.g., thickness, labeled "T" in FIG. 2). According to aspects, the longer dimension (H) of each of the first electrode layer 208, the resistive-switching material layer 210, and the second electrode layer 212 extends orthogonally above the planar substrate in a same direction. For example, as shown, the longer dimension (H) of the first electrode layer 208 extends in the same direction as the longer dimension (H) of the resistive-switching material layer 210 and the second electrode layer 212, which is orthogonal to a surface plane of the planar substrate 202. In some cases, a depth dimension (not shown in FIG. 2) of each of the first electrode layer 208, the resistive-switching material layer 210, and the second electrode layer 212 may extend into and/or out of the page of the cross-section of FIG. 2. The depth may be greater than the longer dimension (H) and the shorter dimension (T).

As noted above, each MIM stack 204 may include a plurality of stacked fin-like MIM structures 206. For example, the MIM stack 204a may include a first MIM structure 206a, a second MIM structure 206b, and a third MIM structure (not labeled in FIG. 2). According to aspects, as shown, the second MIM structure 206b is stacked vertically on top of the first MIM structure 206a. Likewise, as show in FIG. 2, the third MIM structure is stacked vertically on top of the second MIM structure 206b, forming the MIM stack 204a. The remaining MIM stacks 204b-204d may be configured in the same manner as MIM stack 204a, as shown. According to aspects, stacking the MIM structures 206 of the RRAM 200 in this manner allows for a higher-density RRAM as explained below. Further, it should be understood that, while FIG. 2 illustrates only three MIM structures 206 in each of the MIM stacks 204a-204d, the MIM stacks 204a-204d are not limited to only three MIM structures 206 and may include any number of MIM structures 206.

Additionally, as illustrated, the plurality of MIM structures 206 may be laterally disposed with respect to each other across a surface of the planar substrate 202 in different MIM stacks of the plurality of MIM stacks 204a-204d. For example, as illustrated, the first MIM structure 206a may be disposed at an edge of the surface plane of the planar substrate 202. Additionally, a fourth MIM structure 206c may be disposed laterally adjacent to the first MIM structure 206a across the surface plane of the planar substrate 202 in the MIM stack 204b, and so on.

In some cases, each of the first electrode layer 208 and the second electrode layer 212 may be approximately 2-5 nanometers (nm) thick and made from any of various suitable electrically conductive materials, such as titanium nitride (TiN). Additionally, the resistive-switching material layer 210 may be approximately 1 nm thick and made from any of various suitable materials capable of having oxygen vacancies, such as hafnium oxide ($HfO_2$) and/or titanium oxide ($TiO_2$).

According to aspects, when a sufficient voltage (e.g., "forming voltage") is applied to the first electrode layer 208 and the second electrode layer 212, one or more conductive pathways will form in the resistive-switching material layer 210, reducing the resistance (i.e., increasing the conductance) between the first electrode layer 208 and the second electrode layer 212. Through the appropriate application of various voltages (e.g., a set voltage and a reset voltage), the conductive pathways may be modified to form a high resistance state or a low resistance state, allowing a logical value (e.g., "0" or "1") to be stored in the resistive-switching material 210, for example, using oxygen vacancies.

In some cases, a first dielectric layer 214 may be deposited between two or more adjacent MIM stacks of the plurality of MIM stacks 204a-204d. The first dielectric layer 214 may extend vertically above the planar substrate 202. For example, as illustrated, the RRAM 200 may include a first MIM stack 204a and a second MIM stack 204b disposed laterally with respect to the first MIM stack 204a across at least a portion of the surface plane of the planar surface 202. According to aspects, the first MIM stack 204a may be separated from the second MIM stack 204b by at least one layer, such as the first dielectric layer 214. Consequently, the first dielectric layer 214 may separate the MIM structures 206 of the first MIM stack 204a and the second MIM stack 204b. For example, as illustrated, the first MIM structure 206a of the first MIM stack 204a may be separated from the fourth MIM structure 206c of the second MIM stack 204b by the first dielectric layer 214.

In some cases, the distance between each laterally displaced MIM structure 206 may be approximately 10 nm, resulting in a "pitch" between MIM structures 206 of approximately 15-20 nm. For example, "pitch" may refer to the distance between the middle of a first MIM structure (e.g., MIM structure 206a) and the middle of an adjacent MIM structure (e.g., MIM structure 206c).

Similarly, a second dielectric layer 216 may be deposited between two or more vertically displaced MIM structures of the plurality of MIM structures 206. For example, as illustrated, the second dielectric layer 216 may be deposited between and separate the first MIM structure 206a and the second MIM structure 206b (or, more specifically, may separate at least the first electrode layer 208 and the resistive-switching material layer 210 of the first and second MIM structures 206a, 206b). In some cases, the first dielectric layer 214 and/or the second dielectric layer 216 comprise at least one of a polycrystalline silicon layer or an oxide layer.

Further, as shown, the first electrode layer 208 of the first MIM structure 206a is electrically disconnected from the first electrode layer 208 of the second MIM structure 206b, being separated by the second dielectric layer 216. Additionally, as shown, the resistive-switching material layer 210 of the first MIM structure 206a is separated from the resistive-switching material layer 210 of the second MIM structure 206b, for example, due to the second dielectric layer 216.

In some cases, however, the second electrode layer 212 of the first MIM structure 206a and the second electrode layer 212 of the second MIM structure 206b are electrically connected. For example, as shown in FIG. 2, the second electrode layer 212 extends vertically above the planar substrate 202 and continuously through the plurality of MIM structures 206, including the first MIM structure 206a, the second MIM structure 206b, and the third MIM structure. In other cases, the second electrode layer 212 may be electrically disconnected between MIM structures. For example, with reference to FIG. 2, the second electrode layer 212 of the first MIM structure 206a and the second electrode layer 212 of the second MIM structure 206b may be electrically disconnected. For example, in this case, the portion of the second electrode layer 212 at 218 would be missing and filled in with the second dielectric layer 216, completely separating the first MIM structure 206a and the second MIM structure 206b.

As noted above, in some cases, the planar substrate 202 (or one or more layers disposed above the planar substrate 202) may include one or more embedded devices, such as front-end-of-line (FEOL) transistors comprising one or more of a gate contact, a source contact, and a drain contact. In some cases, according to aspects, MIM structures corresponding to different MIM stacks may be electrically coupled to different transistors disposed above the planar substrate. For example, in some cases, the plurality of MIM structures 206 in the first MIM stack 204a may be electrically coupled to a first transistor disposed above the planar substrate and below the first MIM stack 204, while the plurality of MIM structures 206 in the second MIM stack 204b may be electrically coupled to a second transistor disposed above the planar substrate and below the second MIM stack 204b.

As can be seen, the fin-like MIM structures 206 allow the vertically stacked multilayer RRAM 200 to increase the RRAM cell density by a factor of XN (e.g., where X=the number of MIM structures per MIM stack, such as 2, 3, 4, etc., and N=the number of MIM structures, such as 2, 3, 4, etc.) as compared to the conventional planar RRAM 100 of FIG. 1. For example, for a same wafer area (L×W), the vertically stacked multilayer RRAM 200 of FIG. 2 increases the density of RRAM cells by 12 as compared to the RRAM 100 of FIG. 1. For example, as illustrated in FIG. 1, one may conceptualize the RRAM 100 as a book (e.g., RRAM cell) lying flat on a surface of a table (e.g., representing the wafer size L×W). Accordingly, as illustrated, only a single RRAM cell may fit on a wafer size L×W. In contrast, one may conceptualize the vertically stacked multilayer RRAM 200 as multiple vertically stacked and laterally expanded books (e.g., RRAM cells) standing up on the same table of size L×W. As can be seen, for the same wafer size of L×W, the vertically stacked multilayer RRAM 200 is able to increase the RRAM cell density by a factor of 12 as compared to the conventional planar RRAM 100.

Figure 3A:
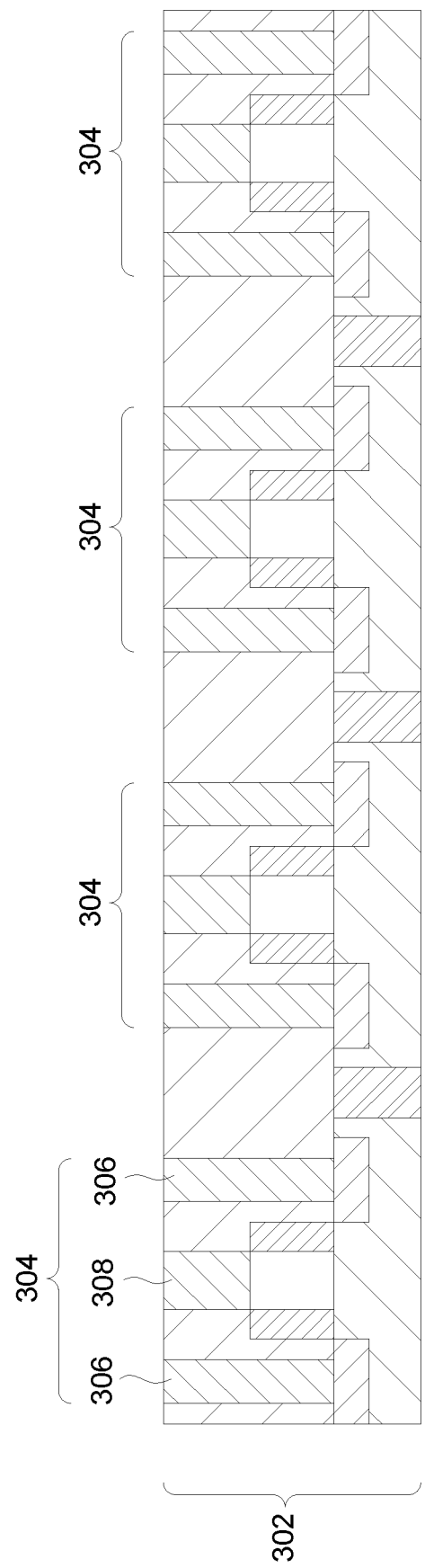
FIGS. 3A-N illustrate example operations for fabricating a vertically stacked multilayer RRAM, in accordance with certain aspects of the present disclosure.
Figure 3B:
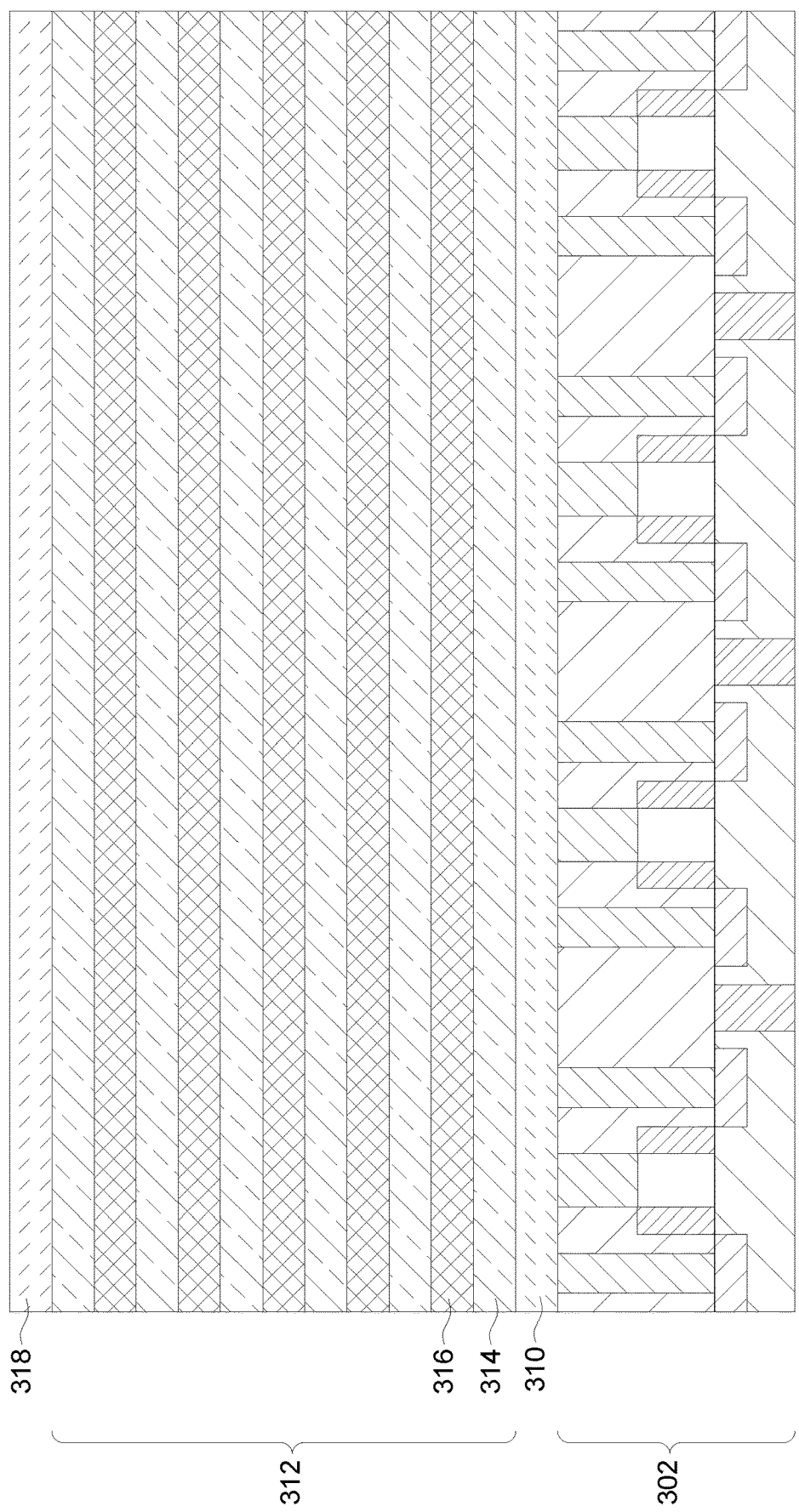
Figure 3C:
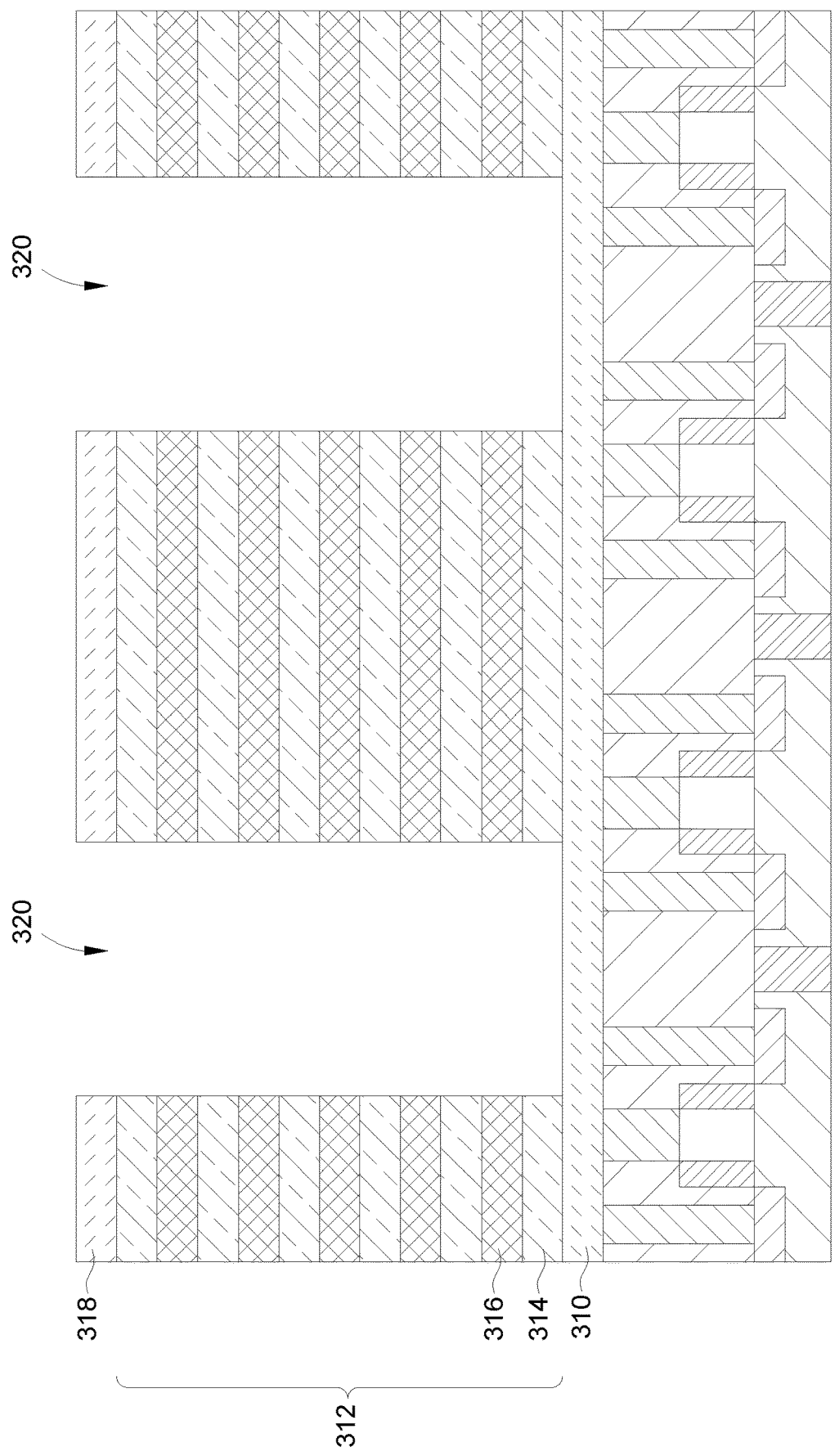
Figure 3D:
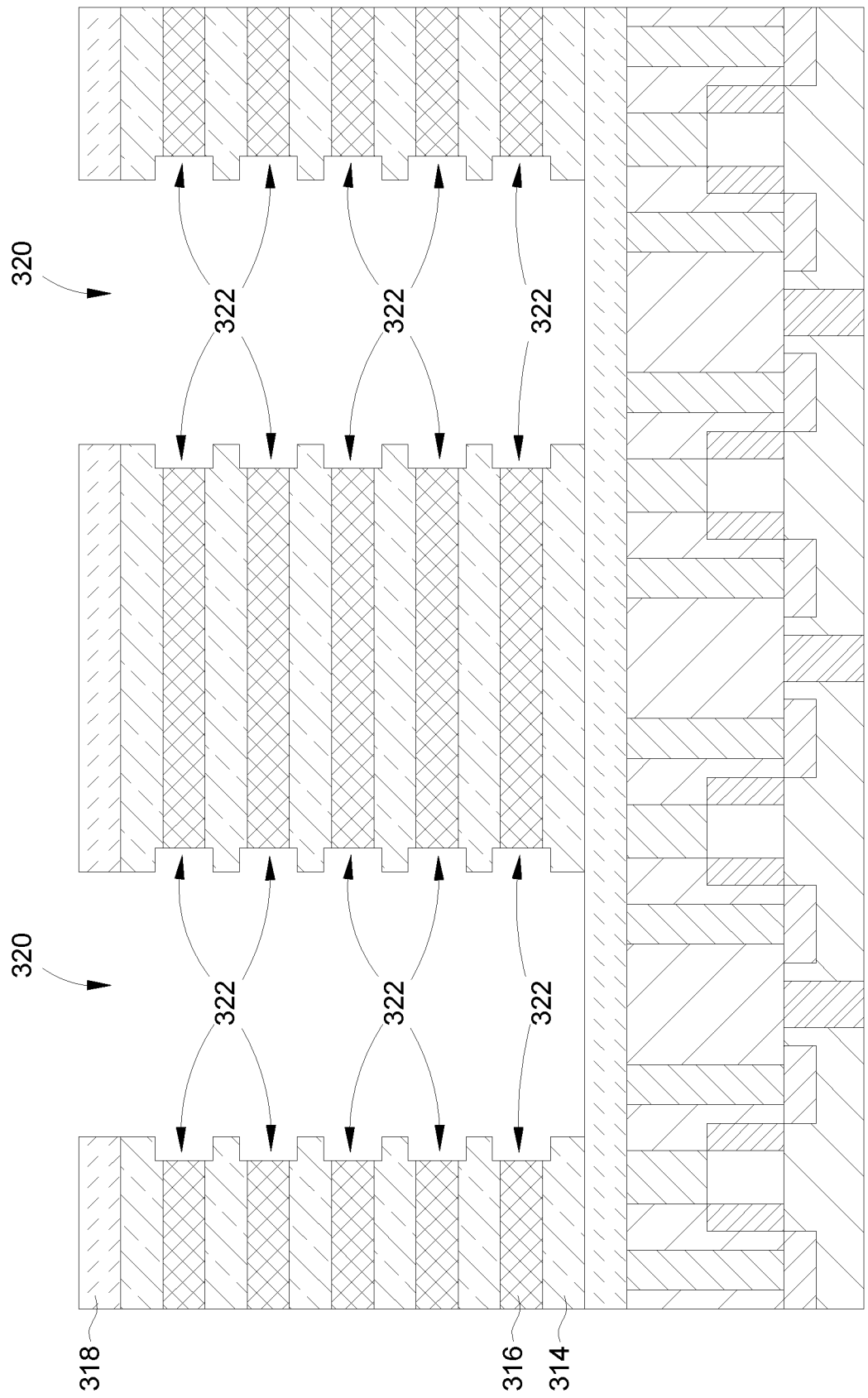
Figure 3E:
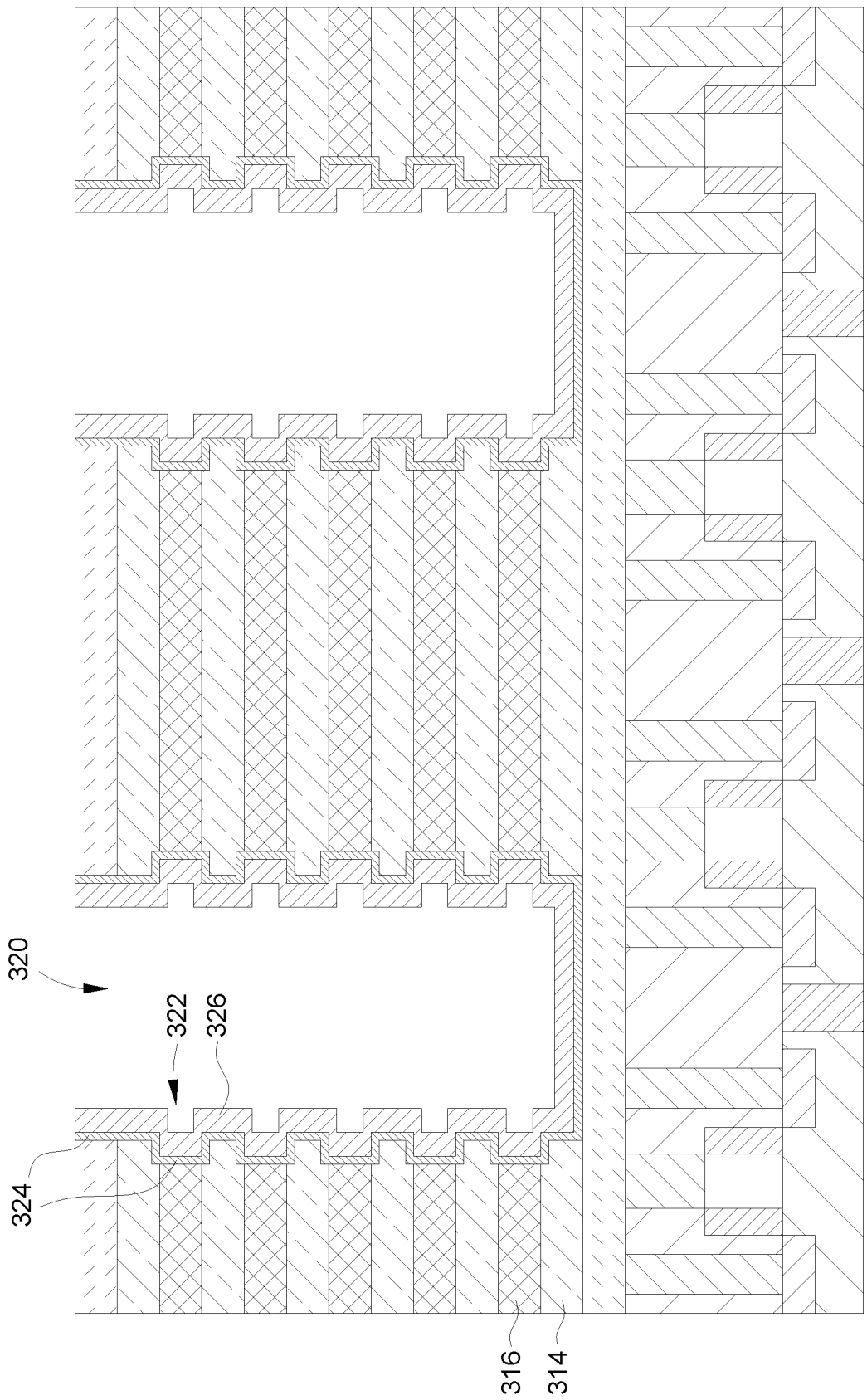
Figure 3F:
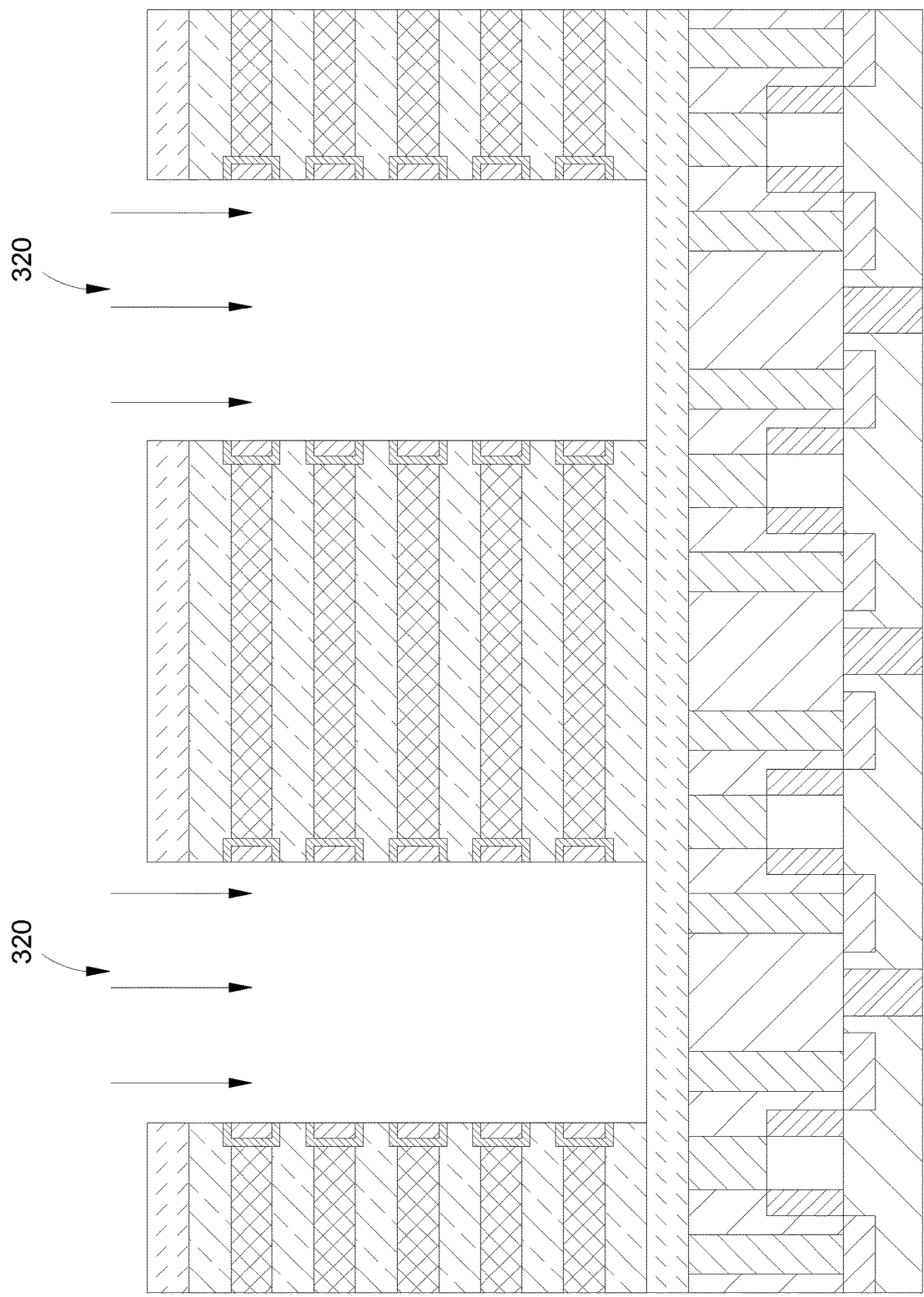
Figure 3G:
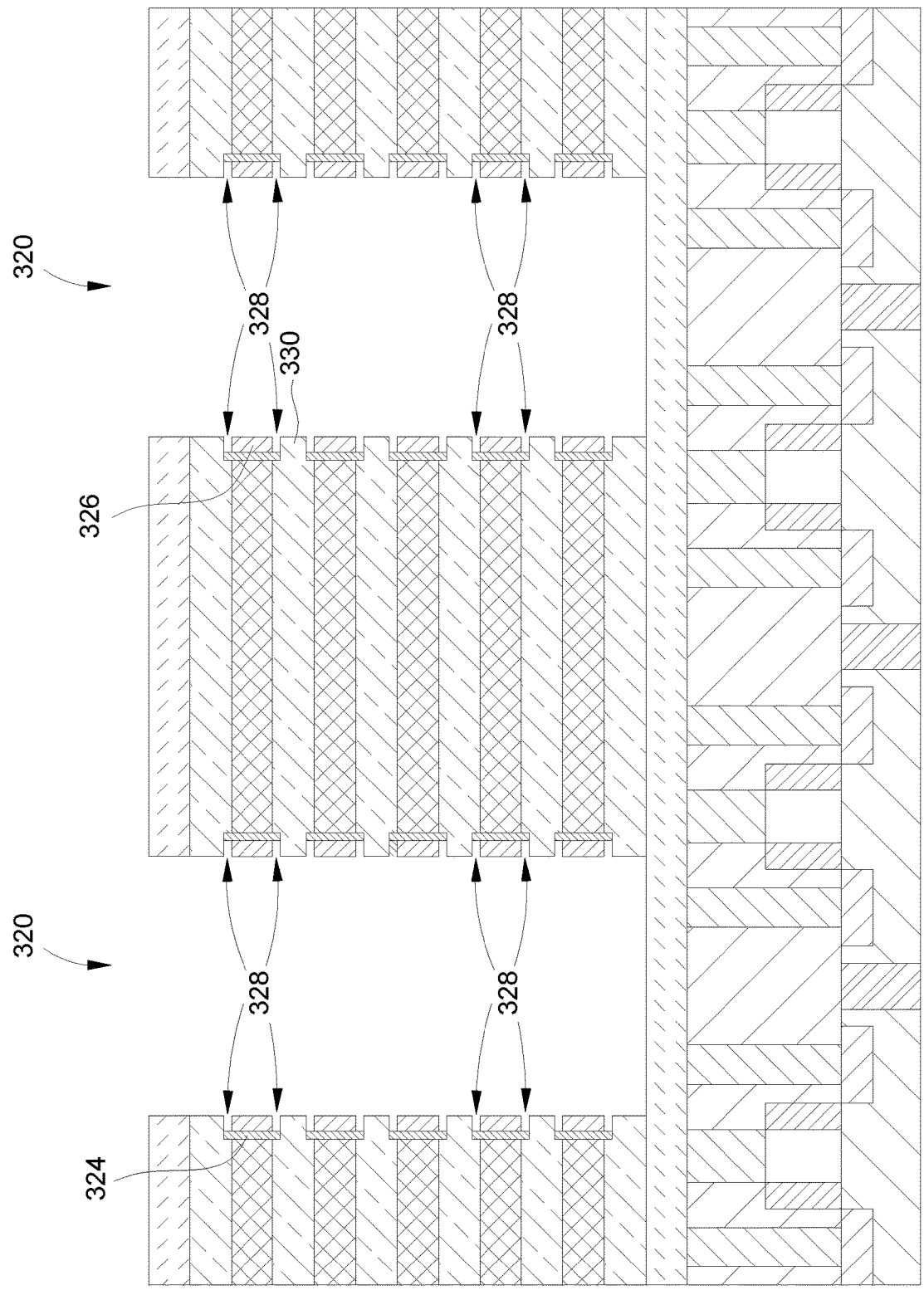
Figure 3H:
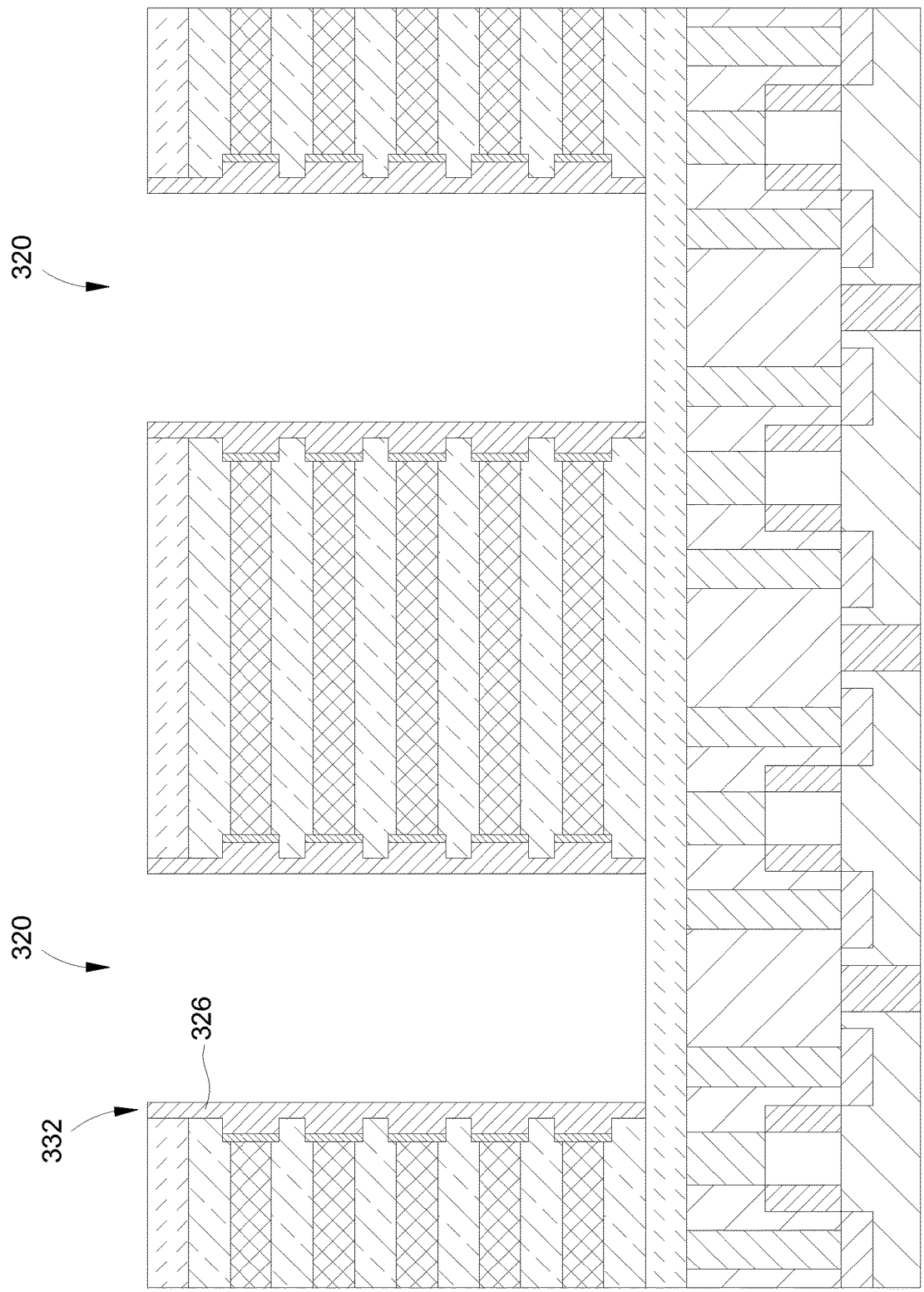
Figure 3I:
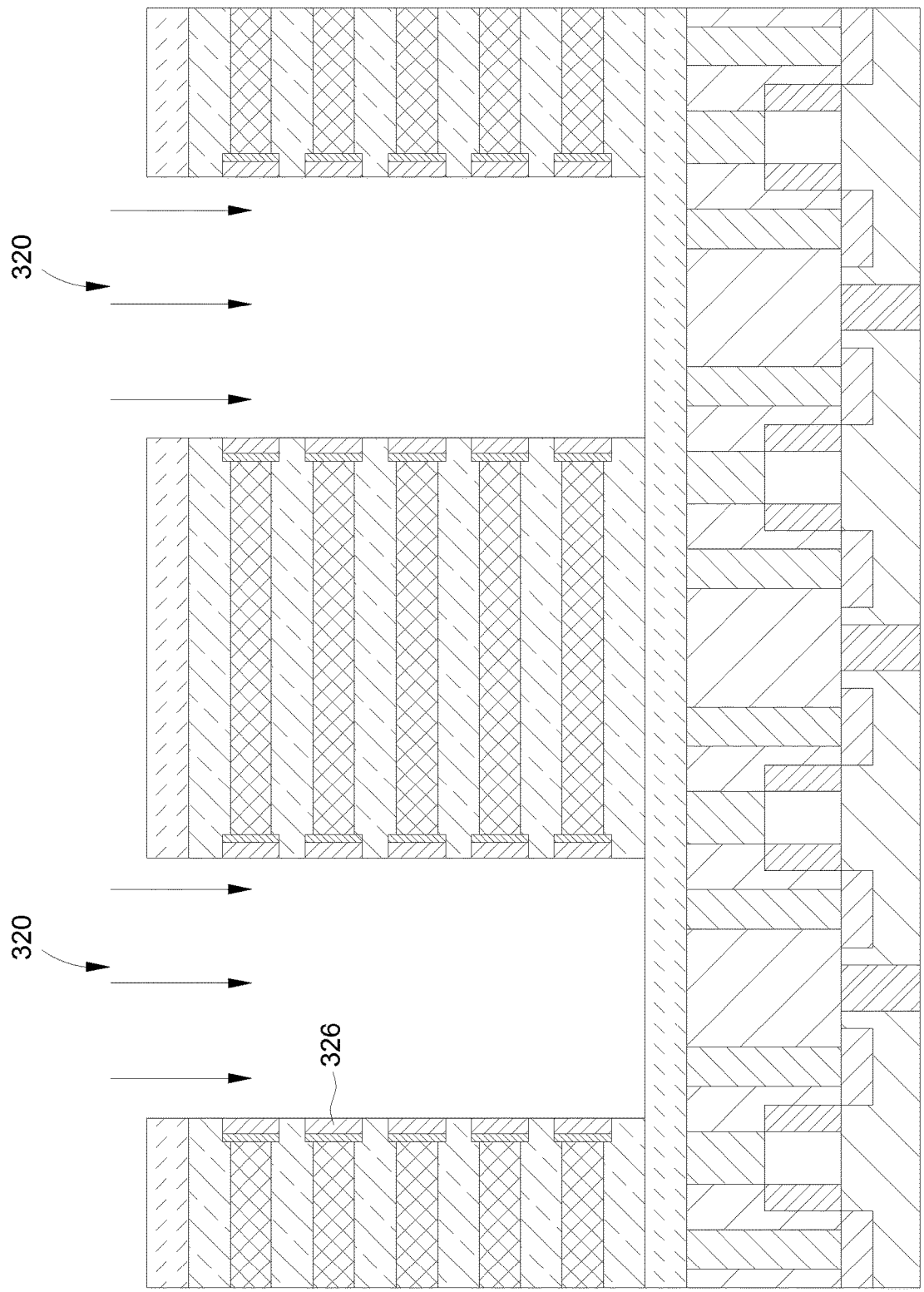
Figure 3J:
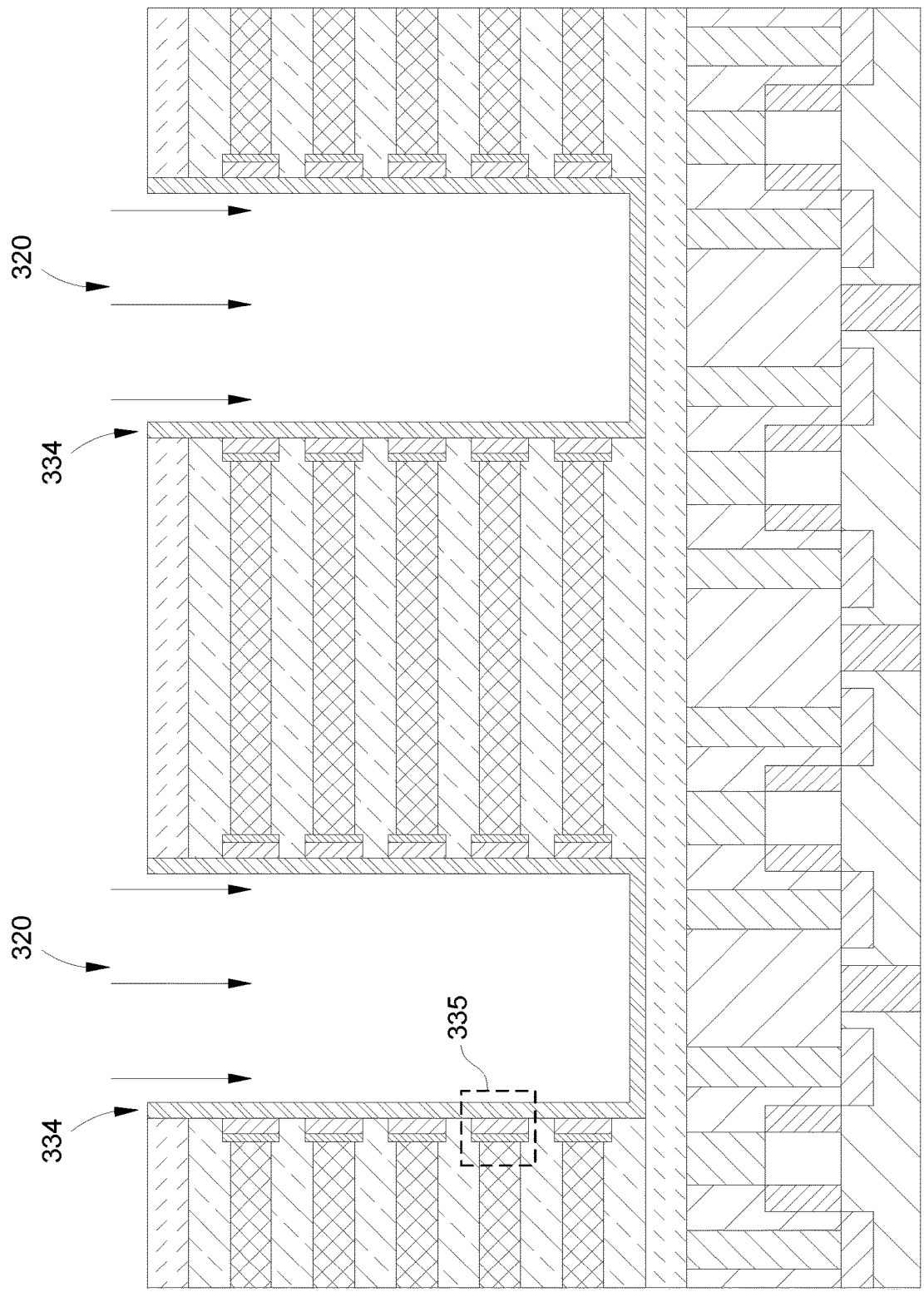
Figure 3K:
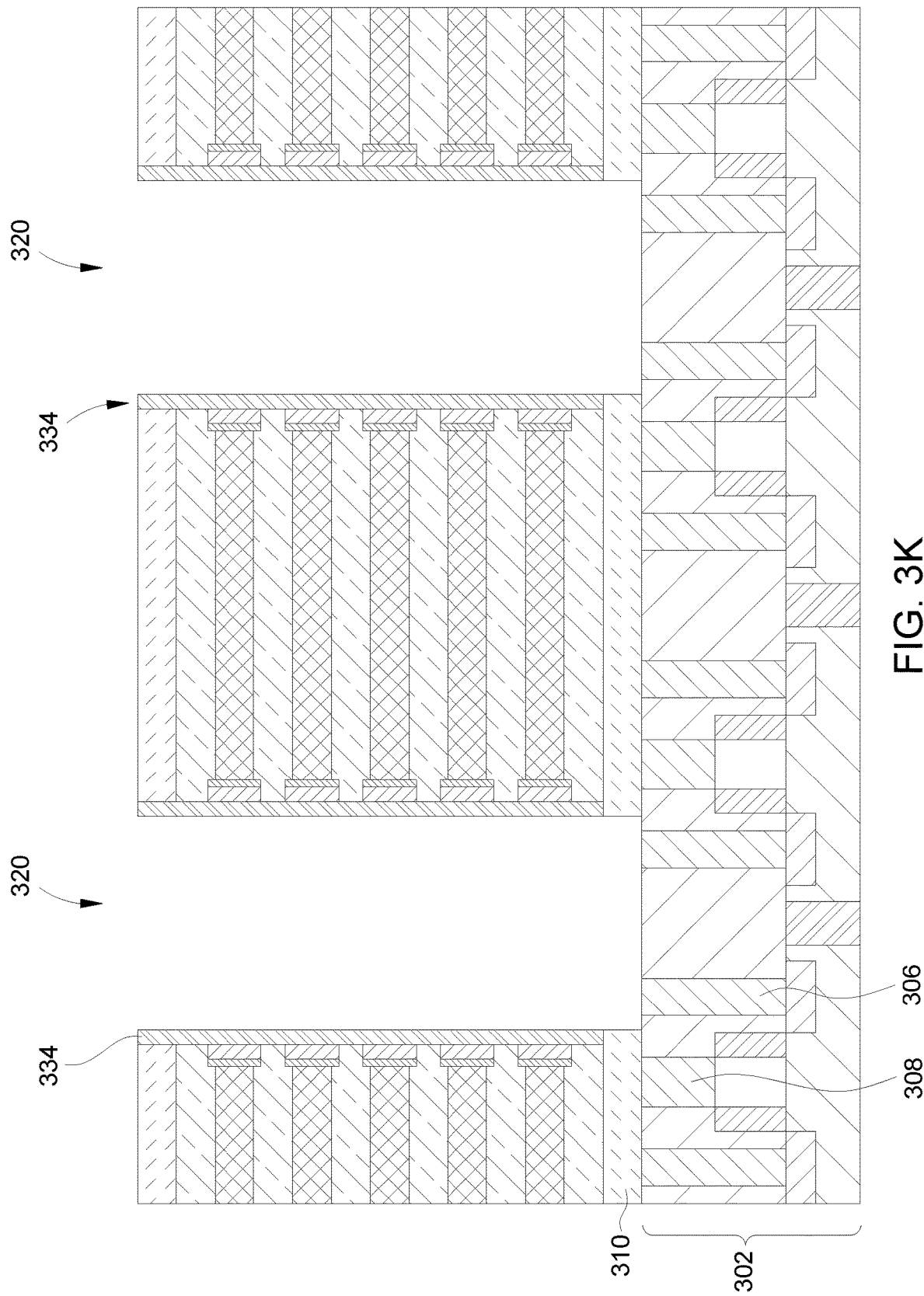
Figure 3L:
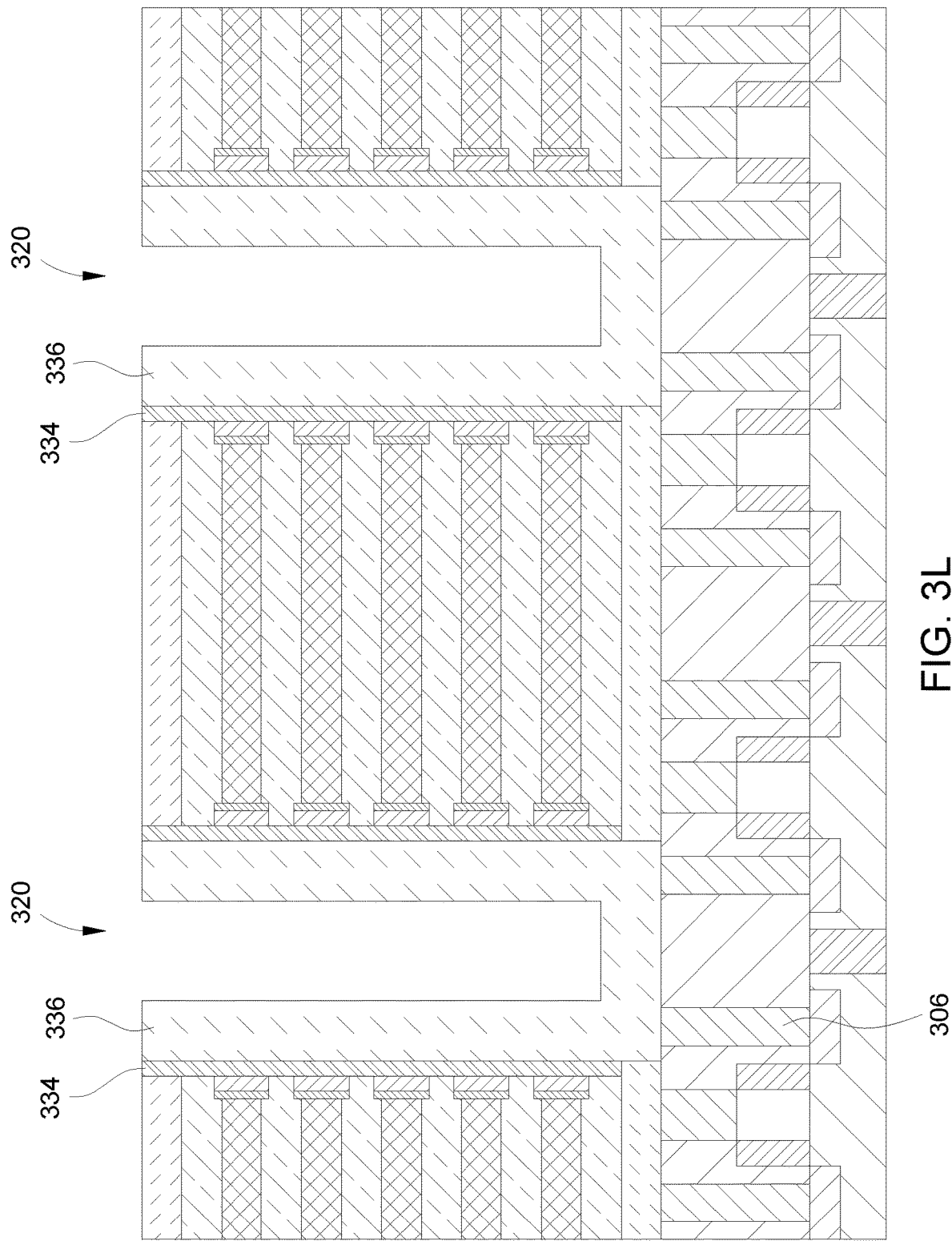
Figure 3M:
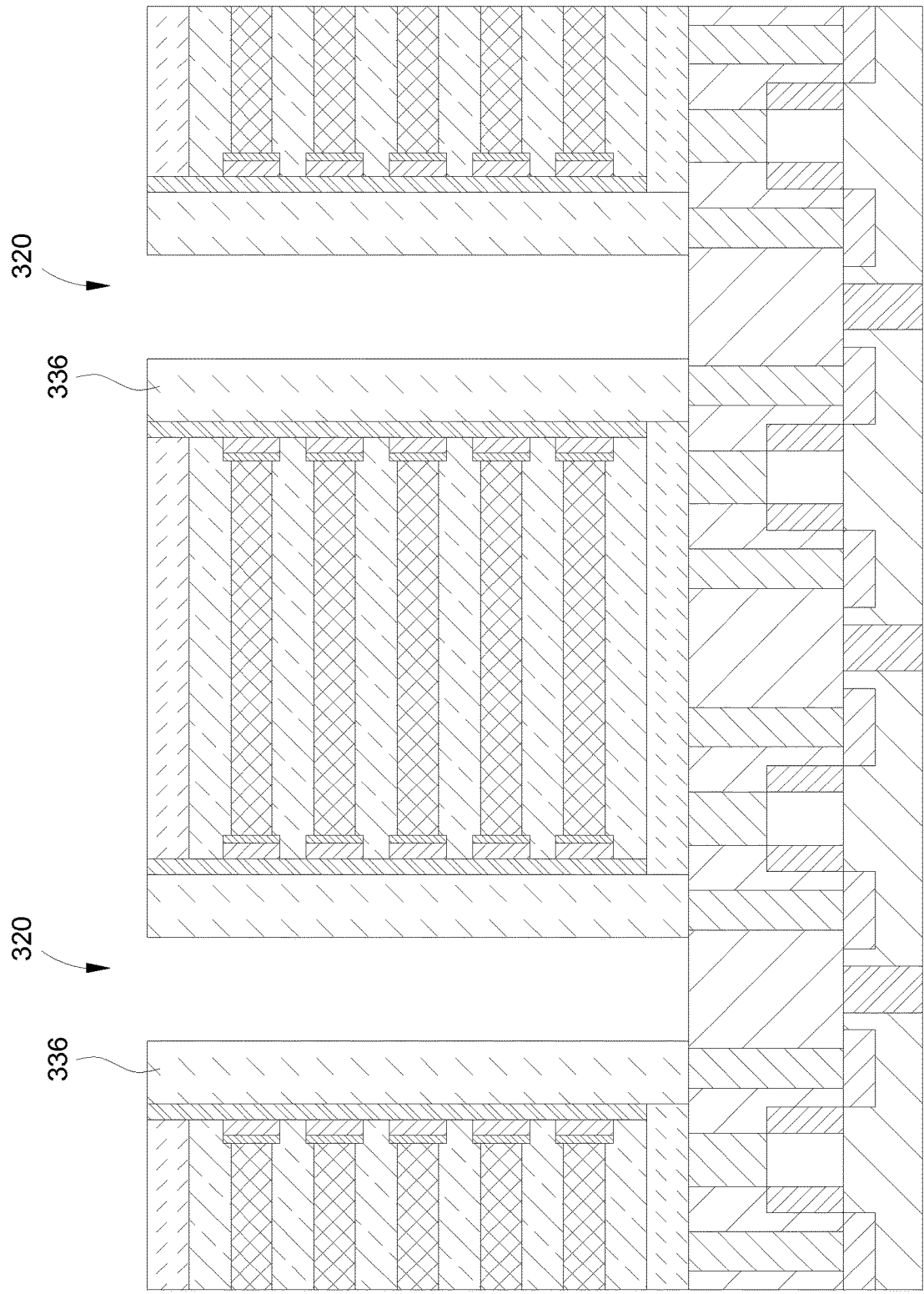
Figure 3N:
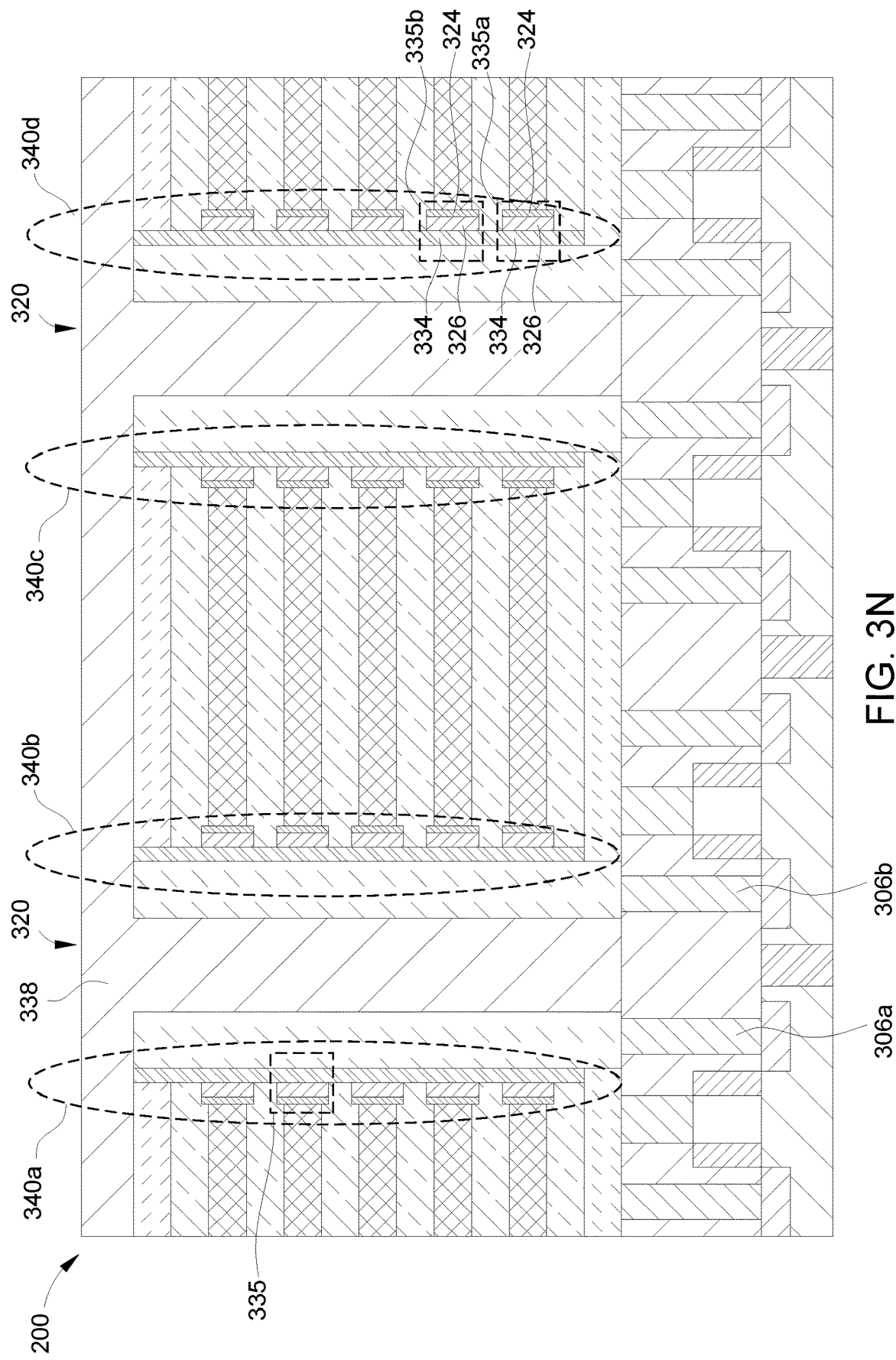

FIGS. 3A-N illustrate example operations for fabricating a vertically stacked multilayer RRAM, such as vertically stacked multilayer RRAM 200, in accordance with certain aspects of the present disclosure. As illustrated in FIG. 3A, the operations may begin with a planar substrate 302, such as a conventional complementary metal-oxide-semiconductor (CMOS) substrate or other transistor flow. Thereafter, fabrication of one or more transistors 304 including source/drain contacts 306 and gate contacts 308 within the planar substrate 302 may be completed.

Thereafter, in FIG. 3B, an etch stop layer 310 may be deposited above the substrate 302. Thereafter, a plurality 312 of alternating oxide (e.g., silicon dioxide ($SiO_2$), ~100 nm) and conducting contact layers (e.g., tungsten (W) or N+ polycrystalline silicon, ~100 nm) may be deposited above the etch stop layer 310. For example, as illustrated, a first oxide layer 314 may be deposited above the etch stop layer 310. Thereafter, a first conducting contact layer 316 may be deposited above the first oxide layer 314. This pattern of layers may then be repeated a plurality of times. Thereafter, a hard mask layer 318 may be deposited above the plurality 312 of alternating oxide layer 314 and conducting contact layers 316. In some cases, the hard mask layer 318 may be composed of silicon nitride ($Si_3N_4$).

Thereafter in FIG. 3C, trenches 320 may be formed through hard mask layer 318 and the plurality 312 of alternating oxide layers 314 and conducting contact layers 316, for example, using photolithography and a hard mask etch. According to aspects, as shown, the trenches 320 may stop at the etch stop layer 310. According to aspects, as illustrated, the trenches 320 form the basis of what will later become the plurality of MIM stacks illustrated in FIG. 2, formed on the sidewalls of the trenches 320.

As illustrated in FIG. 3D, a laterally selective wet or dry etch may be performed to remove exposed portions of the conducting contact layers 316 within the trenches 320, creating wells 322. As illustrated, since the etch is selective, exposed surfaces of the oxide layers 314 and hard mask layer 318 are not etched.

Thereafter, as illustrated in FIG. 3E, atomic layer deposition (ALD) may be performed to deposit a first electrode layer 324 on exposed surfaces of the conducting contact layers 316 and oxide layer 314 in the wells 322 as well as the sidewalls and bottom of the trenches 320. In some cases, the first electrode layer 324 may be composed of an electrically conductive material, such as titanium nitride (TiN). Additionally, as illustrated, a resistive-switching material layer 326 may be deposited on exposed surfaces of the first electrode layer 324 in the wells 322 as well as the sidewalls and bottom of the trenches 320. In some cases, the resistive-switching material layer 326 may be composed of an oxide material, such as hafnium dioxide ($HfO_2$).

Thereafter, as illustrated in FIG. 3F, a vertical-directional etch may be performed to remove excess of the first electrode layer 324 and the resistive-switching material layer 326 from the sidewalls and bottom of the trenches 320.

Thereafter, as illustrated in FIG. 3G, a selective etch may be performed to remove portions 328 of the first electrode layer 324 adjacent to the top and bottom of the resistive-switching material layer 326 due to the deposition process shown in FIG. 3E. As illustrated, the selective etch performed in FIG. 3G may leave behind finger-like structures 330 in the resistive-switching material layer 326.

Thereafter, as illustrated in FIG. 3H, a second deposition 332 of the resistive-switching material layer 326 may be performed, filling in the removed portions 328 of FIG. 3G with the resistive-switching material layer 326. Additionally, as illustrated, due to the second deposition 332, the resistive-switching material layer 326 may also be deposited on the sidewalls of the trenches 320.

Thereafter, as illustrated in FIG. 3I, a second vertical-directional etch may be performed in the trenches 320 to remove resistive-switching material layer 326 from the sidewalls of the trenches 320.

Thereafter, as illustrated in FIG. 3J, a second electrode layer 334 (e.g., composed of titanium nitride (TiN)) may be deposited on the sidewalls and bottom of the trenches 320, forming a plurality of MIM structures 335 (e.g., corresponding to the plurality of MIM structures 206 of FIG. 2) on the sidewalls of the trenches 320.

Thereafter, as illustrated in FIG. 3K, a third vertical-directional etch may be performed in the trenches 320 to remove the second electrode layer 334 from the bottom of the trenches 320 along with the etch stop layer 310, stopping at the source/drain contacts 306 and gate contacts 308 of the planar substrate 302.

Thereafter, as illustrated in FIG. 3L, a contact layer 336 may be deposited on the sidewalls and the bottom of the trenches 320 (e.g., adjacent to the second electrode layer 334), providing electrical contact between the second electrode layer 334 and the source/drain contacts 306. In some cases, the contact layer 336 may be composed of a conducting material, such as tungsten (W) or N-doped polycrystalline silicon (N+ polysilicon).

Thereafter, as illustrated in FIG. 3L, a self-aligning etch may be performed to remove the contact layer 336 from the bottom of the trenches 320.

Thereafter, as illustrated in FIG. 3N, the trenches 320 may be at least partially filled with a dielectric layer 338, and chemical-mechanical polishing (CMP) may be performed.

As illustrated in FIG. 3N, the vertically stacked multilayer RRAM 200 includes a planar substrate 302 and a plurality of MIM stacks 340*a*-340*d*. Further, as illustrated, each MIM stack structure of the plurality of MIM stacks 340*a*-340*d* comprises a plurality of MIM structures 335 extending orthogonally above the planar substrate. Further, as illustrated, each MIM structure of the plurality of MIM structures 335 comprises the first electrode layer 324, the resistive-switching material layer 326, and the second electrode layer 334. As can be seen, the resistive-switching material layer 326 is disposed substantially between the first electrode layer 324 and the second electrode layer 334. Further, as illustrated, each of the first electrode layer 324, the resistive-switching material layer 326, and the second electrode layer 334 comprises a longer dimension and a shorter dimension. According to aspects, the longer dimension of each of the first electrode layer 324, the resistive-switching material layer 326, and the second electrode layer 334 extends orthogonally above the planar substrate 302 in a same direction.

Further, as illustrated in FIG. 3N, the plurality of MIM structures 335 comprises a first MIM structure 335*a* and a second MIM structure 335*b*. As shown, the second MIM structure 335*b* is stacked vertically on top of the first MIM structure 335*a*. Further, in some cases, the first electrode layer 324 of the first MIM structure 335*a* is electrically disconnected from the first electrode layer 324 of the second MIM structure 335*b*. Likewise, as shown, the resistive-switching material layer 326 of the first MIM structure 335*a* is separated from the resistive-switching material layer 326 of the second MIM structure 335*b*.

As illustrated in FIG. 3N, in some cases, the second electrode layer 334 of the first MIM structure 335*a* and the second electrode layer 334 of the second MIM structure 335*b* are electrically connected. For example, as illustrated, the second electrode layer 334 extends vertically above the planar substrate 302 and continuously through the plurality of MIM structures 335, including the first MIM structure 335*a* and second MIM structure 335*b* of the MIM stack 340*d*. In other cases, the second electrode layer 334 of the first MIM structure 335*a* and the second electrode layer 334 of the second MIM structure 335*b* are electrically disconnected (not shown in FIG. 3N).

According to aspects, as shown, the plurality of MIM stacks 340*a*-340*d* comprises a first MIM stack 340*a* and a second MIM stack 340*b*. As illustrated, the second MIM stack 340*b* is disposed laterally with respect to the first MIM 340*a* stack across at least a portion of the planar substrate 302. Further, as illustrated, the first MIM stack 340*a* is separated from the second MIM stack 340*b* by at least one layer, such as the dielectric layer 338. Further, as illustrated, the at least one layer (e.g., the dielectric layer 338) extends vertically above the planar substrate 302 separating the plurality of MIM structures 335 of each of the first MIM stack 340*a* and the second MIM stack 340*b*.

According to aspects, as noted above, the vertically stacked multilayer 200 may include a contact layer 336 providing an electrical connection between the second electrode layer 334 and the source/drain contacts 306. In certain cases, the plurality of MIM structures 335 of the different MIM stacks 340*a*-340*d* may be connected to different source/drain contacts 306. For example, in some cases, as illustrated in FIG. 3N, the plurality of MIM structures 335 in the first MIM stack 340*a* may be electrically coupled to a first transistor (e.g., via source/drain contacts 306*a*) disposed above the planar substrate 302. Additionally, in some cases, the plurality of MIM structures 335 in the second MIM stack 340*b* may be electrically coupled to a second transistor (e.g., via source/drain contacts 306*b*) disposed above the planar substrate 302.

FIG. 4 is a flow diagram illustrating example operations 400 for fabricating a vertically stacked multilayer resistive random access memory (RRAM) device, in accordance with certain aspects of the present disclosure. The operations 400 may be performed, for example, by a semiconductor processing facility.

The operations 400 begin, at block 402, with the semiconductor processing facility forming a plurality of metal-insulator-metal (MIM) stacks above a planar substrate. In some cases, each MIM stack structure of the plurality of MIM stacks comprises a plurality of MIM structures extending orthogonally above the planar substrate. Additionally, in some cases, each MIM structure of the plurality of MIM structures comprises a first electrode layer, a resistive-switching material layer, and a second electrode layer. Additionally, in some cases, the resistive-switching material layer is disposed substantially between the first electrode layer and the second electrode layer. Additionally, in some cases, each of the first electrode layer, the resistive-switching material layer, and the second electrode layer comprises a longer dimension and a shorter dimension. Additionally, in some cases, the longer dimension of each of the first electrode layer, the resistive-switching material layer, and the second electrode layer extends orthogonally above the planar substrate in a same direction. Additionally, in some cases, the plurality of MIM structures comprises a first MIM structure and a second MIM structure. Additionally, in some cases, the second MIM structure is stacked vertically on top of the first MIM structure. Additionally, in some cases, the first electrode layer of the first MIM structure is electrically disconnected from the first electrode layer of the second MIM structure. Additionally, in some cases, the resistive-switching material layer of the first MIM structure is separated from the resistive-switching material layer of the second MIM structure.

Further, in some cases, the second electrode layer of the first MIM structure and the second electrode layer of the second MIM structure are electrically connected. For example, in some cases, the second electrode layer extends vertically above the planar substrate and continuously through the plurality of MIM structures.

In other cases, the second electrode layer of the first MIM structure and the second electrode layer of the second MIM structure are electrically disconnected.

In some cases, at least one of the first electrode layer or the second electrode layer comprises titanium nitride. Additionally, in some cases, wherein the resistive-switching material layer comprises hafnium oxide or titanium oxide.

According to aspects, in some cases, the planar substrate comprises a first substrate layer and a second substrate layer disposed above the first substrate layer. Additionally, in some cases, the first substrate layer comprises one of silicon, glass, ceramic, or aluminum oxide. Additionally, in some cases, the second substrate layer comprises silicon dioxide.

Further, in some cases, the plurality of MIM stacks comprises a first MIM stack and a second MIM stack. For example, in some cases, the second MIM stack is disposed laterally with respect to the first MIM stack across at least a portion of the planar substrate. Further, in some cases, the first MIM stack is separated from the second MIM stack by at least one layer. For example, in some cases, the at least one layer comprises at least one of a polycrystalline silicon layer or an oxide layer. Further, in some cases, the at least one layer extends vertically above the planar substrate separating the plurality of MIM structures of each of the first MIM stack and the second MIM stack.

Additionally, in some cases, the plurality of MIM structures in the first MIM stack are electrically coupled to a first transistor disposed above the planar substrate. Additionally, in some cases, the plurality of MIM structures in the second MIM stack are electrically coupled to a second transistor disposed above the planar substrate.

Further, in some cases, forming the plurality of MIM stacks may include forming an etch stop layer above the planar substrate. Further, in some cases, forming the plurality of MIM stacks may include forming a plurality of alternating oxide and conducting contact layers above the etch stop layer. Further, forming the plurality of MIM stacks may include forming a hard mask layer above the plurality of alternating oxide and conducting contact layers. Further, in some cases, forming the plurality of MIM stacks may include forming trenches through the hard mask layer and the plurality of alternating oxide layers and conducting contact layers.

Further, in some cases, forming the plurality of MIM stacks may include forming a plurality of wells in sidewalls of the trenches by performing a selective etch on exposed portions of the conducting contact layers within the trenches 320. Further, in some cases, forming the plurality of MIM stacks may include forming a first electrode layer on exposed surfaces of the plurality of alternating oxide layers and conducting contact layers within the wells. Further, in some cases, forming the plurality of MIM stacks may include forming a resistive-switching material layer on exposed surfaces of the first electrode layer in the wells. Further, forming the plurality of MIM stacks may include forming a second electrode layer on exposed surfaces of the resistive-switching material layer on the sidewalls of the trenches.

Further, in some cases, forming the plurality of MIM stacks may include forming a contact layer on exposed surfaces of the second electrode layer on the sidewalls a bottom of the trenches. Further, in some cases, forming the plurality of MIM stacks may include filling the trenches at least partially with a dielectric layer.

Within the present disclosure, the word "exemplary" is used to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage, or mode of operation. The term "coupled" is used herein to refer to the direct or indirect coupling between two objects. For example, if object A physically touches object B and object B touches object C, then objects A and C may still be considered coupled to one another—even if objects A and C do not directly physically touch each other. For instance, a first object may be coupled to a second object even though the first object is never directly physically in contact with the second object. The terms "circuit" and "circuitry" are used broadly and intended to include both hardware implementations of electrical devices and conductors that, when connected and configured, enable the performance of the functions described in the present disclosure, without limitation as to the type of electronic circuits.

The apparatus and methods described in the detailed description are illustrated in the accompanying drawings by various blocks, modules, components, circuits, steps, processes, algorithms, etc. (collectively referred to as "elements"). These elements may be implemented using hardware, for example.

One or more of the components, steps, features, and/or functions illustrated herein may be rearranged and/or combined into a single component, step, feature, or function or embodied in several components, steps, or functions. Additional elements, components, steps, and/or functions may also be added without departing from features disclosed herein. The apparatus, devices, and/or components illustrated herein may be configured to perform one or more of the methods, features, or steps described herein.

It is to be understood that the specific order or hierarchy of steps in the methods disclosed is an illustration of exemplary processes. Based upon design preferences, it is understood that the specific order or hierarchy of steps in the methods may be rearranged. The accompanying method claims present elements of the various steps in a sample order, and are not meant to be limited to the specific order or hierarchy presented unless specifically recited therein.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but are to be accorded the full scope consistent with the language of the claims, wherein reference to an element in the singular is not intended to mean "one and only one" unless specifically so stated, but rather "one or more." Unless specifically stated otherwise, the term "some" refers to one or more. A phrase referring to "at least one of" a list of items refers to any combination of those items, including single members. As an example, "at least one of: a, b, or c"

is intended to cover at least: a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c). All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. § 112(f) unless the element is expressly recited using the phrase "means for" or, in the case of a method claim, the element is recited using the phrase "step for."

What is claimed is:

1. A resistive random access memory (RRAM) device comprising:
   a planar substrate; and
   a plurality of metal-insulator-metal (MIM) stacks, wherein:
   each MIM stack structure of the plurality of MIM stacks comprises a plurality of MIM structures extending orthogonally above the planar substrate;
   each MIM structure of the plurality of MIM structures comprises a first electrode layer, a resistive-switching material layer, and a second electrode layer;
   the resistive-switching material layer is disposed substantially between the first electrode layer and the second electrode layer;
   each of the first electrode layer, the resistive-switching material layer, and the second electrode layer comprises a longer dimension and a shorter dimension;
   the longer dimension of each of the first electrode layer, the resistive-switching material layer, and the second electrode layer extends orthogonally above the planar substrate in a same direction;
   the plurality of MIM structures comprises a first MIM structure and a second MIM structure;
   the second MIM structure is stacked vertically on top of the first MIM structure;
   the first electrode layer of the first MIM structure is electrically disconnected from the first electrode layer of the second MIM structure;
   the second electrode layer of the first MIM structure and the second electrode layer of the second MIM structure are electrically disconnected; and
   the resistive-switching material layer of the first MIM structure is separated from the resistive-switching material layer of the second MIM structure.

2. The RRAM device of claim 1, wherein at least one of the first electrode layer or the second electrode layer comprises titanium nitride.

3. The RRAM device of claim 1, wherein the resistive-switching material layer comprises hafnium oxide or titanium oxide.

4. The RRAM device of claim 1, wherein:
   the planar substrate comprises a first substrate layer and a second substrate layer disposed above the first substrate layer;
   the first substrate layer comprises one of silicon, glass, ceramic, or aluminum oxide; and
   the second substrate layer comprises silicon dioxide.

5. The RRAM device of claim 1, wherein:
   the plurality of MIM stacks comprises a first MIM stack and a second MIM stack; and
   the second MIM stack is disposed laterally with respect to the first MIM stack across at least a portion of the planar substrate.

6. The RRAM device of claim 5, wherein the first MIM stack is separated from the second MIM stack by at least one layer.

7. The RRAM device of claim 6, wherein the at least one layer comprises at least one of a polycrystalline silicon layer or an oxide layer.

8. The RRAM device of claim 6, wherein the at least one layer extends vertically above the planar substrate separating the plurality of MIM structures of each of the first MIM stack and the second MIM stack.

9. The RRAM device of claim 5, wherein:
   the plurality of MIM structures in the first MIM stack are electrically coupled to a first transistor disposed above the planar substrate; and
   the plurality of MIM structures in the second MIM stack are electrically coupled to a second transistor disposed above the planar substrate.

10. A method for fabricating a resistive random access memory (RRAM) device comprising:
    forming a plurality of metal-insulator-metal (MIM) stacks above a planar substrate such that:
    each MIM stack structure of the plurality of MIM stacks comprises a plurality of MIM structures extending orthogonally above the planar substrate;
    each MIM structure of the plurality of MIM structures comprises a first electrode layer, a resistive-switching material layer, and a second electrode layer;
    the resistive-switching material layer is disposed substantially between the first electrode layer and the second electrode layer;
    each of the first electrode layer, the resistive-switching material layer, and the second electrode layer comprises a longer dimension and a shorter dimension;
    the longer dimension of each of the first electrode layer, the resistive-switching material layer, and the second electrode layer extends orthogonally above the planar substrate in a same direction;
    the plurality of MIM structures comprises a first MIM structure and a second MIM structure;
    the second MIM structure is stacked vertically on top of the first MIM structure;
    the first electrode layer of the first MIM structure is electrically disconnected from the first electrode layer of the second MIM structure;
    the second electrode layer of the first MIM structure and the second electrode layer of the second MIM structure are electrically disconnected; and
    the resistive-switching material layer of the first MIM structure is separated from the resistive-switching material layer of the second MIM structure.

11. The method of claim 10, wherein forming the plurality of MIM stacks comprises:
    forming an etch stop layer above the planar substrate;
    forming a plurality of alternating oxide layers and conducting contact layers above the etch stop layer;
    forming a hard mask layer above the plurality of alternating oxide layers and conducting contact layers;
    forming trenches through the hard mask layer and the plurality of alternating oxide layers and conducting contact layers; and
    forming a plurality of wells in sidewalls of the trenches by performing a selective etch on exposed portions of the conducting contact layers within the trenches.

12. The method of claim 11, wherein forming the plurality of MIM stacks further comprises:
forming the first electrode layer on exposed surfaces of the plurality of alternating oxide layers and conducting contact layers within the wells;
forming the resistive-switching material layer on exposed surfaces of the first electrode layer in the wells;
forming the second electrode layer on exposed surfaces of the resistive-switching material layer on the sidewalls of the trenches;
forming a contact layer on exposed surfaces of the second electrode layer on the sidewalls of the trenches; and
at least partially filling the trenches with a dielectric layer.

13. The method of claim 10, wherein forming the plurality of MIM stacks above the planar substrate comprises forming the plurality of MIM stacks above the planar substrate such that:
the second electrode layer of the first MIM structure and the second electrode layer of the second MIM structure are electrically connected; and
the second electrode layer extends vertically above the planar substrate and continuously through the plurality of MIM structures.

14. The method of claim 10, wherein forming the plurality of MIM stacks above the planar substrate comprises forming the plurality of MIM stacks above the planar substrate such that:
at least one of the first electrode layer or the second electrode layer comprises titanium nitride;
the resistive-switching material layer comprises hafnium oxide or titanium oxide;
the planar substrate comprises a first substrate layer and a second substrate layer disposed above the first substrate layer;
the first substrate layer comprises one of silicon, glass, ceramic, or aluminum oxide; and
the second substrate layer comprises silicon dioxide.

15. The method of claim 10, wherein forming the plurality of MIM stacks above the planar substrate comprises forming the plurality of MIM stacks above the planar substrate such that:
the plurality of MIM stacks comprises a first MIM stack and a second MIM stack; and
the second MIM stack is disposed laterally with respect to the first MIM stack across at least a portion of the planar substrate;
the first MIM stack is separated from the second MIM stack by at least one layer;
the at least one layer comprises at least one of a polycrystalline silicon layer or an oxide layer; and
the at least one layer extends vertically above the planar substrate separating the plurality of MIM structures of each of the first MIM stack and the second MIM stack.

16. The method of claim 15, wherein forming the plurality of MIM stacks above the planar substrate comprises forming the plurality of MIM stacks above the planar substrate such that:
the plurality of MIM structures in the first MIM stack are electrically coupled to a first transistor disposed above the planar substrate; and
the plurality of MIM structures in the second MIM stack are electrically coupled to a second transistor disposed above the planar substrate.

* * * * *